(12) United States Patent
He et al.

(10) Patent No.: US 11,450,253 B2
(45) Date of Patent: Sep. 20, 2022

(54) DISPLAY PANEL AND ELECTRONIC DEVICE

(71) Applicant: Shenzhen China Star Optoelectronics Semiconductor Display Technology Co., Ltd., Shenzhen (CN)

(72) Inventors: Xiaojin He, Shenzhen (CN); Chengcai Dong, Shenzhen (CN); Ilgon Kim, Shenzhen (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 225 days.

(21) Appl. No.: 16/765,477

(22) PCT Filed: Apr. 21, 2020

(86) PCT No.: PCT/CN2020/085803
§ 371 (c)(1),
(2) Date: May 20, 2020

(87) PCT Pub. No.: WO2021/203471
PCT Pub. Date: Oct. 14, 2021

(65) Prior Publication Data
US 2022/0114934 A1    Apr. 14, 2022

(30) Foreign Application Priority Data

Apr. 9, 2020   (CN) .......................... 202010274940.5

(51) Int. Cl.
*G09G 3/20*    (2006.01)

(52) U.S. Cl.
CPC ....... *G09G 3/20* (2013.01); *G09G 2300/0408* (2013.01); *G09G 2310/0267* (2013.01);
(Continued)

(58) Field of Classification Search
None
See application file for complete search history.

(56) References Cited

U.S. PATENT DOCUMENTS

2010/0001941 A1*  1/2010  Shin .................. G09G 3/3677
                                                              345/98
2012/0001894 A1   1/2012  Kim et al.
(Continued)

FOREIGN PATENT DOCUMENTS

CN          101727859         6/2010
CN          101625837         1/2012
(Continued)

*Primary Examiner* — Christopher J Kohlman

(57) ABSTRACT

The present invention provides a display panel and an electronic device. A gate driver on array (GOA) circuit in the display panel includes a plurality of cascaded GOA units. The GOA units include a plurality of effective GOA units and 2m redundant GOA units arranged in sequence. The plurality of effective GOA units forms a plurality of effective GOA modules that are arranged in sequence. In the effective GOA module, the 2m effective GOA units are sequentially connected to the 2m clock signal lines, and the 2m redundant GOA units are sequentially connected to the 2m clock signal lines. The display panel of the present invention has no periodic dark lines at low gray levels.

19 Claims, 8 Drawing Sheets

(52) U.S. Cl.
  CPC ... *G09G 2310/061* (2013.01); *G09G 2310/08* (2013.01); *G09G 2320/0233* (2013.01)

(56) References Cited

U.S. PATENT DOCUMENTS

| | | |
|---|---|---|
| 2012/0075275 A1 | 3/2012 | Chen et al. |
| 2012/0086627 A1* | 4/2012 | Chen .................... G09G 3/3677 345/100 |
| 2018/0149889 A1* | 5/2018 | Kim ......................... G09G 3/22 |
| 2019/0019467 A1 | 1/2019 | Kim et al. |

FOREIGN PATENT DOCUMENTS

| | | |
|---|---|---|
| CN | 102314845 | 1/2012 |
| CN | 106328075 | 1/2017 |
| CN | 106652927 | 5/2017 |
| CN | 107993627 | 5/2018 |
| CN | 109036316 | 12/2018 |
| CN | 109119036 | 1/2019 |

\* cited by examiner

DISPLAY PANEL AND ELECTRONIC DEVICE

RELATED APPLICATIONS

This application is a National Phase of PCT Patent Application No. PCT/CN2020/085803 having International filing date of Apr. 21, 2020, which claims the benefit of priority of Chinese Patent Application No. 202010274940.5 filed on Apr. 9, 2020. The contents of the above applications are all incorporated by reference as if fully set forth herein in their entirety.

FIELD AND BACKGROUND OF THE INVENTION

The present invention relates to the field of display technologies, and in particular, to a display panel and an electronic device.

Current 8K display panels comprise a plurality of clock signal lines and gate driver on array (GOA) circuits. The GOA circuits comprise a plurality of cascaded GOA units. Each GOA unit is connected to one of the clock signal lines. The clock signal line provides a clock signal to the GOA unit to control the GOA unit to output driving signals. However, the number of GOA units connected to each clock signal line in the current display panels is not uniform. Therefore, a load of each clock signal line is also different, resulting in periodic dark lines in the display panels at low gray levels and affecting display effect.

Therefore, the current display panels have a technical problem of generating periodic dark lines at the low gray levels and need to be improved.

SUMMARY OF THE INVENTION

Embodiments of the present invention provide a display panel and an electronic device, which are used to alleviate the technical problems where current display panels generate periodic dark lines at low gray levels.

In order to solve the above problems, technical solutions provided by the present invention are as follows:

An embodiment of the present invention provides a display panel, comprising:

a plurality of scan lines disposed in a display region;

2m clock signal lines disposed in a signal line setting region in a non-display region; and a gate driver on array (GOA) circuit disposed between the display region and the signal line setting region, wherein the GOA circuit comprises a plurality of cascaded GOA units, the GOA units comprise a plurality of effective GOA units and 2m redundant GOA units arranged in sequence, driving signal output ends of the effective GOA units are sequentially connected to the scan lines corresponding one-to-one, the plurality of effective GOA units forms a plurality of effective GOA modules that are arranged in sequence, each effective GOA module comprises 2m effective GOA units, wherein in the effective GOA module, clock signal input ends of the 2m effective GOA units are sequentially connected to the 2m clock signal lines corresponding one-to-one, and clock signal input ends of the 2m redundant GOA units are sequentially connected to the 2m clock signal lines corresponding one-to-one.

In the display panel of the present invention, structures of the 2m redundant GOA units are the same.

In the display panel of the present invention, structures of the redundant GOA unit and the effective GOA unit are the same.

In the display panel of the present invention, in the GOA circuit, every m GOA units form a GOA module from a first one, and a rear GOA module is used to provide a reset signal to a previous GOA module between the adjacent GOA modules.

In the display panel of the present invention, a driving signal output end of an n-stage GOA unit in the rear GOA module is connected to a reset signal end of an n-stage GOA unit in the previous GOA module.

In the display panel of the present invention, a driving signal output end of an n-stage GOA unit in the previous GOA module is connected to a driving signal input end of an n-stage GOA unit in the rear GOA module.

In the display panel of the present invention, in the GOA module formed by the m GOA units from the first one, a driving signal input end of each GOA unit is connected to a frame start signal line.

In the display panel of the present invention, in the GOA circuit, an n-stage GOA unit comprises:

a pull-up control module connected to a first node to pull up a potential of the first node according to a pre-stage stage transfer signal;

a pull-up module connected to the first node to pull up a potential of a current-stage gate driving signal according to a current-stage clock signal;

a signal download module connected to the first node to control an output of a current-stage stage transfer signal according to the current-stage clock signal;

a first pull-down module used to pull down the potential of the current-stage gate driving signal according to a first post-stage gate driving signal;

a second pull-down module connected to the first node and used to pull down the potential of the first node according to a second post-stage gate driving signal;

a first pull-down maintenance module connected to the first node to maintain low potentials of the first node and the current-stage gate driving signal according to a first low-frequency clock signal; and a second pull-down maintenance module connected to the first node to maintain the low potentials of the first node and the current-stage gate driving signal according to a second low-frequency clock signal, wherein the first low-frequency clock signal and the second low-frequency clock signal have opposite potentials at a same time;

wherein both the first pull-down maintenance module and the second pull-down maintenance module comprise a reverse unit and a maintenance unit, an output end of the reverse unit is connected to an input end of the maintenance unit, at least one of the reverse units is a first reverse unit, the first reverse unit comprises a first reverse transistor, a second reverse transistor, and a third reverse transistor, a gate and a first electrode of the first reverse transistor are connected to a low-frequency clock signal input end, a second electrode of the first reverse transistor and a first electrode of the second reverse transistor are connected to a second node, a gate of the second reverse transistor is connected to the first node, a second electrode of the second reverse transistor is connected to a low potential signal of a first power supply, a gate and a first electrode of the third reverse transistor are connected to the second node, and a second electrode of the third reverse transistor is connected to the input end of the maintenance unit.

In the display panel of the present invention, the maintenance unit comprises a first maintenance transistor and a second maintenance transistor, a gate of the first maintenance transistor and a gate of the second maintenance transistor are connected to the input end of the maintenance unit, a first electrode of the first maintenance transistor is connected to the low potential signal of the first power supply, a second electrode of the first maintenance transistor is connected to the first node, a first electrode of the second maintenance transistor is connected to a low potential signal of a second power supply, and a second electrode of the second maintenance transistor is connected to the current-stage gate driving signal.

In the display panel of the present invention, both the reverse units in the first pull-down maintenance module and the second pull-down maintenance module are the first reverse units.

In the display panel of the present invention, one of the reverse units in the first pull-down maintenance module and the second pull-down maintenance module is the first reverse unit, and another reverse unit is a second reverse unit, the second reverse unit comprises a fourth reverse transistor, a fifth reverse transistor, a sixth reverse transistor, and a seventh reverse transistor, a gate and a first electrode of the fourth reverse transistor are connected to the low-frequency clock signal input end, a second electrode of the fourth reverse transistor and a first electrode of the fifth reverse transistor are connected to a third node, a gate of the fifth reverse transistor is connected to the first node, a second electrode of the fifth reverse transistor is connected to the low potential signal of the first power supply, a gate of the sixth reverse transistor is connected to the third node, a first electrode of the sixth reverse transistor is connected to the first electrode of the fourth reverse transistor, a second electrode of the sixth reverse transistor and a first electrode of the seventh reverse transistor are connected to the input end of the maintenance unit, a gate of the seventh reverse transistor is connected to the first node, and a second electrode of the seventh reverse transistor is connected to the low potential signal of the first power supply.

In the display panel of the present invention, the pull-up control module comprises a first transistor, a gate and a first electrode of the first transistor are connected to the pre-stage stage transfer signal, and a second electrode of the first transistor is connected to the first node.

In the display panel of the present invention, the pull-up module comprises a second transistor, a gate of the second transistor is connected to the first node, a first electrode of the second transistor is connected to the current-stage clock signal, and a second electrode of the second transistor is connected to the current-stage gate driving signal.

In the display panel of the present invention, the signal download module comprises a third transistor, a gate of the third transistor is connected to the first node, a first electrode of the third transistor is connected to the current-stage clock signal, and a second electrode of the third transistor is connected to the current-stage stage transfer signal.

In the display panel of the present invention, the first pull-down module comprises a fourth transistor, a gate of the fourth transistor is connected to the first post-stage gate driving signal, a first electrode of the fourth transistor is connected to the low potential signal of the second power supply, and a second electrode of the fourth transistor is connected to the current-stage gate driving signal.

In the display panel of the present invention, the second pull-down module comprises a fifth transistor, a gate of the fifth transistor is connected to the second post-stage gate driving signal, a first electrode of the fifth transistor is connected to the low potential signal of the first power supply, and a second electrode of the fifth transistor is connected to the first node.

The present invention further provides an electronic device, comprising a display panel and a driving chip, wherein the display panel comprises:

a plurality of scan lines disposed in a display region;

2m clock signal lines disposed in a signal line setting region in a non-display region; and a GOA circuit disposed between the display region and the signal line setting region, wherein the GOA circuit comprises a plurality of cascaded GOA units, the cascaded GOA units comprise a plurality of effective GOA units and 2m redundant GOA units arranged in sequence, driving signal output ends of the effective GOA units are sequentially connected to the scan lines corresponding one-to-one, the plurality of effective GOA units forms a plurality of effective GOA modules that are arranged in sequence, each effective GOA module comprises 2m effective GOA units, wherein in the effective GOA module, clock signal input ends of the 2m effective GOA units are sequentially connected to the 2m clock signal lines corresponding one-to-one, and the clock signal input ends of the 2m redundant GOA units are sequentially connected to the 2m clock signal lines corresponding one-to-one.

In the electronic device of the present invention, structures of the 2m redundant GOA units are same.

In the electronic device of the present invention, structures of the redundant GOA unit and the effective GOA units are the same.

In the electronic device of the present invention, in the GOA circuit, every m GOA units form a GOA module from a first one, and a rear GOA module is used to provide a reset signal to a previous GOA module between adjacent GOA module.

Beneficial effects of the present invention: Embodiments of the present invention provide a display panel and an electronic device. The display panel comprises a plurality of scan lines, 2m clock signal lines, and a gate driver on array (GOA) circuit. The plurality of scan lines is disposed in a display region. The clock signal lines are disposed in a signal line setting region in a non-display region. The GOA circuit is disposed between the display region and the signal line setting region. The GOA circuit comprises a plurality of cascaded GOA units. The GOA units comprise a plurality of effective GOA units and 2m redundant GOA units arranged in sequence. Driving signal output ends of the effective GOA units are sequentially connected to the scan lines corresponding one-to-one. The plurality of effective GOA units forms a plurality of effective GOA modules that are arranged in sequence. Each effective GOA module comprises 2m effective GOA units, wherein in the effective GOA module, clock signal input ends of the 2m effective GOA units are sequentially connected to the 2m clock signal lines corresponding one-to-one, and clock signal input ends of the 2m redundant GOA units are sequentially connected to the 2m clock signal lines corresponding one-to-one. In the present invention, the number of GOA units connected to each clock signal line is equal, so a load of each clock signal line is the same, and periodic dark lines will not be generated at low gray levels.

BRIEF DESCRIPTION OF THE SEVERAL VIEWS OF THE DRAWINGS

In order to more clearly illustrate the embodiments or the technical solutions in the prior art, a brief introduction of the drawings used in the embodiments or the prior art description will be briefly described below. Obviously, the drawings in the following description are only some of the embodiments of the invention, and those skilled in the art can obtain other drawings according to the drawings without any creative work.

DESCRIPTION OF SPECIFIC EMBODIMENTS OF THE INVENTION

The following description of the various embodiments is provided with reference to the accompanying drawings. Directional terms, such as upper, lower, front, back, left, right, inner, outer, and lateral side, mentioned in the present invention are only for reference. Therefore, the directional terms are used for describing and understanding rather than limiting the present invention. In the figures, units having similar structures are used for the same reference numbers.

Embodiments of the present invention provide a display panel and an electronic device, which are used to alleviate technical problems that current display panels generate periodic dark lines at low gray levels.

The display panel of the present invention comprises a plurality of scan lines, 2m clock signal lines, and a gate driver on array (GOA) circuit. The plurality of scan lines is disposed in a display region. The clock signal lines are disposed in a signal line setting region in a non-display region. The GOA circuit is disposed between the display region and the signal line setting region. The GOA circuit comprises a plurality of cascaded GOA units. The GOA units comprise a plurality of effective GOA units and 2m redundant GOA units arranged in sequence. Driving signal output ends of the effective GOA units are sequentially connected to the scan lines corresponding one-to-one. The plurality of effective GOA units forms a plurality of effective GOA modules that are arranged in sequence. Each effective GOA module comprises 2m effective GOA units, wherein in the effective GOA module, clock signal input ends of the 2m effective GOA units are sequentially connected to the 2m clock signal lines corresponding one-to-one, and clock signal input ends of the 2m redundant GOA units are sequentially connected to the 2m clock signal lines corresponding one-to-one.

Figure 1:
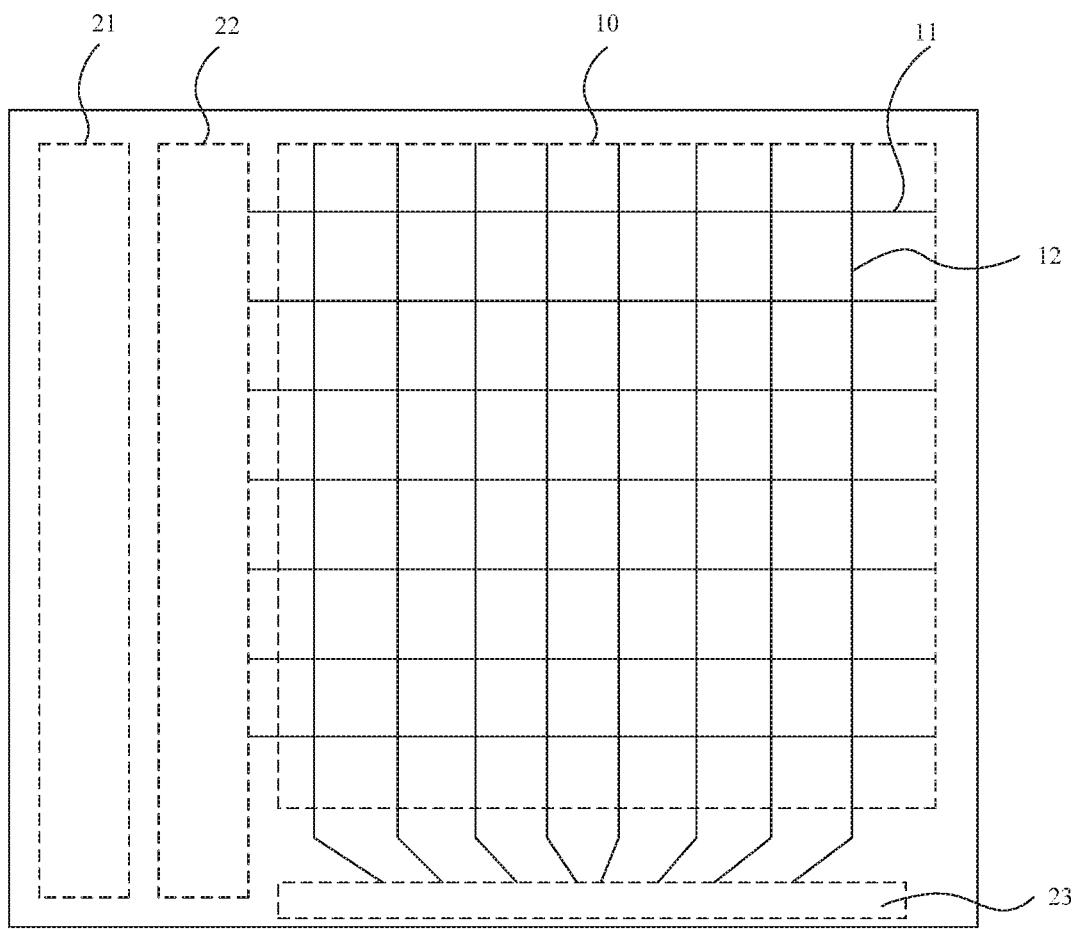
FIG. 1 is a first schematic structural view of a display panel provided by an embodiment of the present invention.

As shown in FIG. 1, which is a first schematic structural view of the display panel provided by an embodiment of the present invention. The display panel comprises a display region 10 and a non-display region disposed around the display region 10. The non-display region comprises a signal line setting region 21, a GOA circuit setting region 22, and a data driving circuit setting region 23. The display region 10 is provided with a plurality of sub-pixels arranged in an array, and each sub-pixel is driven by a pixel driving circuit in the display region 10. A scanning signal and a data signal of the driving transistor in the pixel driving circuit are provided by a scanning line 11 and a data line 12. In the display region 10, in the pixel driving circuit of the sub-pixels in a same row, a gate of the driving transistor is connected to a same gate line 11. In the pixel driving circuit of the sub-pixels in a same column, a source or a drain of the driving transistor is connected to a same data line 12.

A plurality of clock signal lines is disposed in the signal line setting region 21. The GOA circuit setting region 22 is provided with the GOA circuit. The clock signal line provides a clock signal to the GOA circuit, then a gate driving signal is output from the GOA circuit, and the gate driving signal is provided to the scan lines 11.

Figure 2:
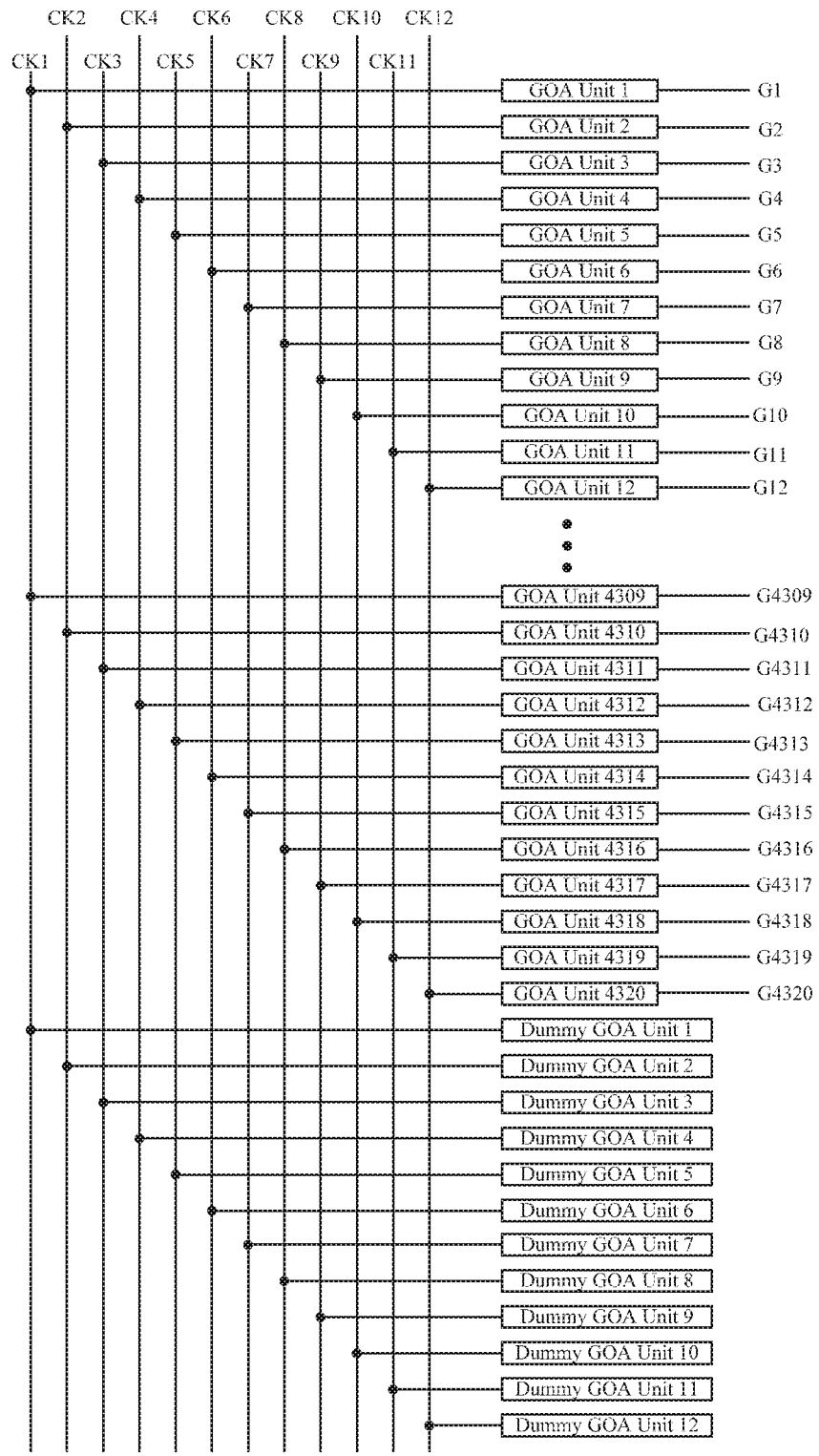
FIG. 2 is a second schematic structural view of the display panel provided by the embodiment of the present invention.

As shown in FIG. 2, which is a second schematic structural view of the display panel provided by the embodiment of the present invention. The embodiment uses an 8K product as an example. A resolution of a display panel in the 8K product is 7680×4320, so it includes 7680 data lines and 4320 scan lines.

The display panel comprises 2m clock signal lines and 4320 scan lines. The GOA circuit comprises a plurality of cascaded GOA units. The GOA units comprise a plurality of effective GOA units and 2m redundant GOA units in order from top to bottom. The effective GOA unit is represented by "GOA Unit," and the redundant GOA unit is represented by "Dummy GOA Unit." A value of m can be any positive integer. In the embodiment, m is 6, so it comprises 12 clock signal lines CK1 to CK12 and 12 redundant GOA units Dummy GOA Units 1 to 12. The 4320 scanning lines are represented by G1 to G4320 respectively.

Driving signal output ends of the effective GOA units are sequentially connected to the scan lines corresponding one-to-one. That is, the number of effective units is consistent with the number of scanning lines. Since there are 4320 scanning lines, the number of effective GOA units is also 4320, which is represented by GOA Units 1 to 4320. Driving signal output ends of the redundant GOA units are not connected to the scan lines.

Each effective GOA unit in the GOA circuit comprises a clock signal input end. The clock signal line is connected to the clock signal input end to input the clock signal to drive the effective GOA unit to work and output the gate driving signal to the corresponding scanning line. For the redundant GOA unit, although it is not connected to the scan line, it also needs to output a signal to the previous effective GOA unit to reset, so it also needs to be connected to the clock signal line.

The 4320 effective GOA units form a plurality of effective GOA modules arranged in sequence, and each effective GOA module comprises 12 effective GOA units. In the effective GOA module, the clock signal input ends of the 12 effective GOA units are sequentially connected to the 12 clock signal lines corresponding one-to-one. As shown in FIG. 2, GOA Units 1 to 12 form an effective GOA module, and GOA Units 13 to 24 form an effective GOA module, and so on, and GOA Units 4309 to 4320 form an effective GOA module. Therefore, the 4320 effective GOA units form 4320/12=360 effective GOA modules. In each effective GOA module, the clock signal input ends of the 12 effective GOA units are sequentially connected to 12 clock signal lines corresponding one-to-one. That is, GOA Unit 1 is connected to CK1, GOA Unit 2 is connected to CK2, and so on, and GOA Unit 12 is connected to CK12. For the same clock signal line, each effective GOA module has a clock signal input end of an effect GOA unit connected to it, so each clock signal line in CK1 to CK12 is connected to the 360 effective GOA units.

In addition, the clock signal input ends of the 12 redundant GOA units arranged after the effective GOA units are also sequentially connected to the 12 clock signal lines corresponding one-to-one. That is, Dummy GOA Unit 1 is connected to CK1, Dummy GOA Unit 2 is connected to CK2, and so on, and Dummy GOA Unit 12 is connected to CK12. Therefore, each clock signal line in CK1 to CK12 is connected to one redundant GOA unit.

According to the above connection method, the number of GOA units connected to each clock signal line in CK1 to CK12 is 361, so loads are uniform. After each clock signal line is input to the effective GOA unit, the gate driving signal output by the effective GOA unit is also stable. Thus, brightness of the display panel in a same gray level is consistent, and no periodic dark lines appear in low gray levels, which improves display effect.

In an embodiment, structures of the 12 redundant GOA units are the same. Having same structures mean that a number of transistors and the connection method in each redundant GOA unit are the same, a driving method after the clock signal line is input to the clock signal of each redundant GOA unit is also the same, so the load of each clock signal line to the redundant GOA unit is also equal.

In an embodiment, a structure of the redundant GOA unit is the same as the effective GOA unit. That is, the number and connections of the transistors in the redundant GOA unit and the effective GOA unit are the same. Setting the structure of the redundant GOA unit and the effective GOA unit to be the same can simplify a manufacturing process and reduce a load difference between the effective GOA unit and the redundant GOA unit connected by the same clock signal line.

Figure 3:
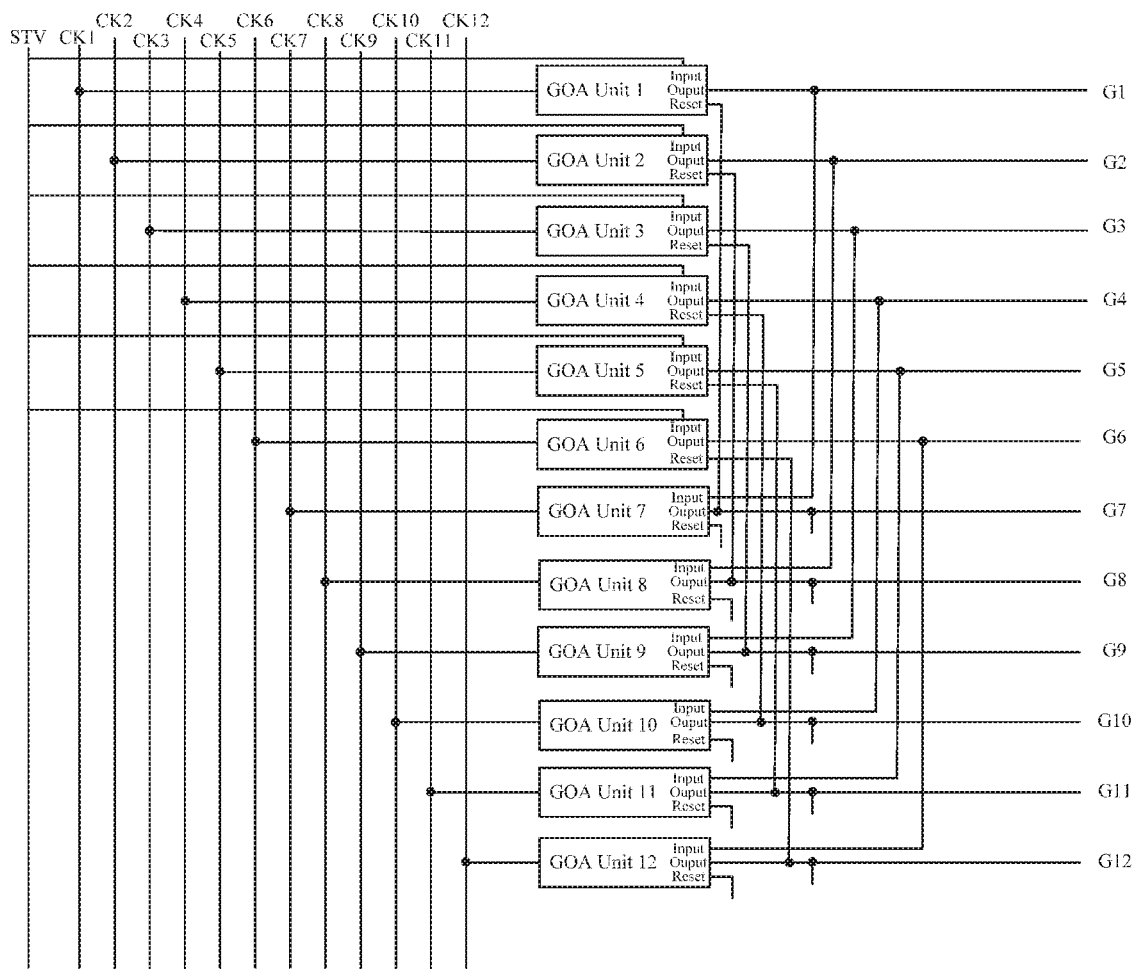
FIG. 3 is a third schematic structural view of the display panel provided by the embodiment of the present invention.
Figure 4:
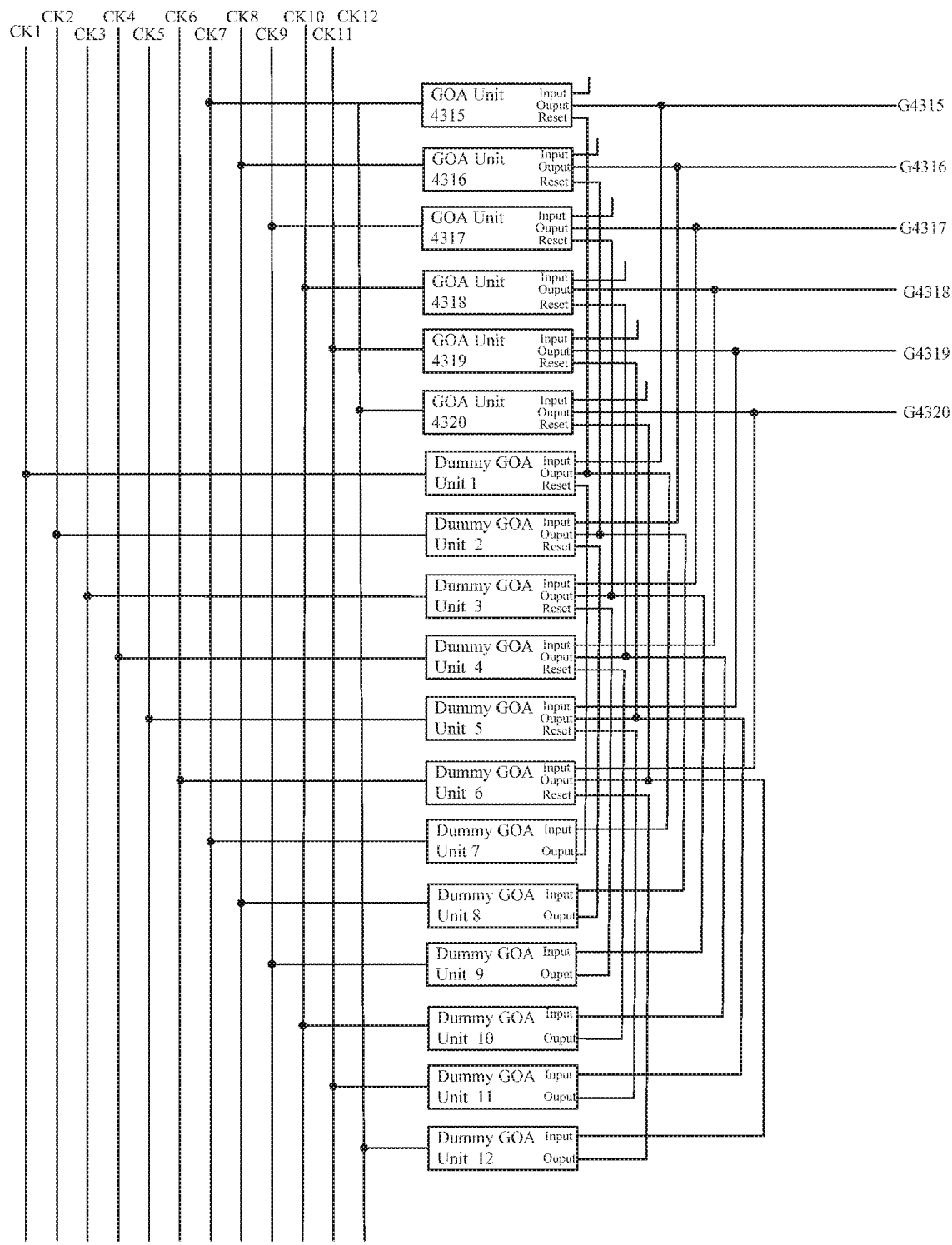
FIG. 4 is a fourth schematic structural view of the display panel provided by the embodiment of the present invention.

FIG. 3 and FIG. 4 show a connection relationship of GOA units in the display panel. FIG. 3 uses the previous 12-stage effective GOA units as an example to explain a signal transmission method between each GOA unit. FIG. 4 uses the last 6-stage effective GOA units and 12-stage of redundant GOA units as an example to explain the signal transmission method between each GOA unit.

In an embodiment, in the GOA circuit, every m GOA units form a GOA module from a first one, and a rear GOA module is used to provide a reset signal to a previous GOA module between the adjacent GOA modules.

In the embodiment of the present invention, m is 6, so as shown in FIG. 3, every 6 GOA units form a GOA module from the first one. That is, GOA Units 1 to 6 is the first GOA module, GOA Units 7 to 12 is the second GOA module, and so on, and Dummy GOA Units 7 to 12 is the last GOA module. The second GOA module provides a reset signal for the first GOA module, the third GOA module provides a reset signal for the second GOA module, and so on, and the last GOA module provides a reset signal for the penultimate GOA module.

Each effective GOA unit comprises a driving signal input end Input, a driving signal output end Output, and a reset signal end Reset.

In an embodiment, a driving signal output end of an n-stage GOA unit in the rear GOA module is connected to a reset signal end of an n-stage GOA unit in the previous GOA module. Wherein, $1 \leq n \leq m$. As shown in FIG. 3, GOA Unit 7 in the second GOA module is the first-stage GOA unit, and GOA Unit 1 in the first GOA module is the first-stage GOA unit. In addition to a scan line G7, an output of the driving signal output of GOA Unit 7 is also connected to the reset signal end of GOA Unit 1 to provide a reset signal to GOA Unit 1. Similarly, the driving signal outputs Output in GOA Units 8 to 12 are connected to reset signal ends Reset of GOA Units 2 to 6 in addition to scan lines G8 to G12 to provide reset signals to GOA Units 2 to 6.

Figure 5:
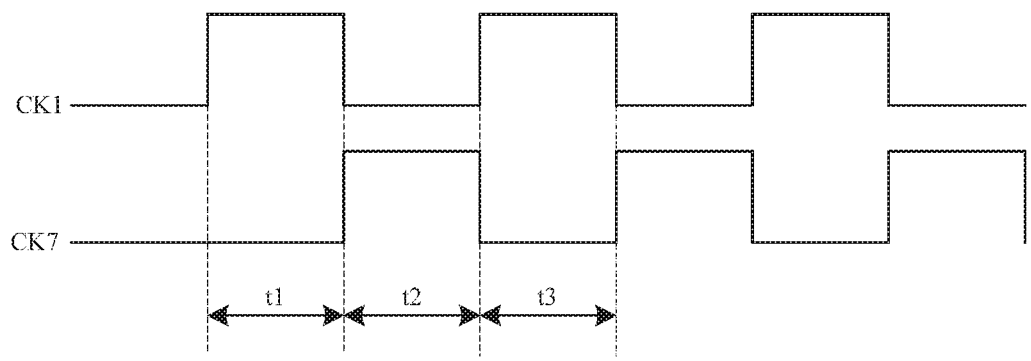
FIG. 5 is a timing diagram of CK1 and CK7 in the display panel provided by the embodiment of the present invention.

A purpose of the reset is to clear the gate driving signal of a previous frame to prevent a crosstalk between a gate driving signal of the previous frame and a gate driving signal of the next frame, thereby affecting picture effect. As shown in FIG. 5, which is a timing diagram of CK1 and CK7, phases of CK1 and CK7 are opposite since t1. At time t1, CK1 begins to input a first high potential, and CK7 has not yet started to lower. CK1 controls GOA Unit 1 to output the gate driving signal to G1. At time t2, CK1 is low and GOA Unit 1 stops outputting the gate driving signal. CK7 starts to input the first high potential and controls GOA Unit 7 to output the gate driving signal to G7. At a same time, the driving signal is transmitted to the reset signal end Reset of GOA Unit 1, and a potential of the gate driving signal output by GOA Unit 1 at time t1 is pulled down, that is, cleared. Then in time t3 period, when a second high potential of CK1 comes, the gate driving signal in time t3 period will not affect the gate drive signal, and crosstalk will not occur, thus ensuring the display effect.

In an embodiment, a driving signal output end of an n-stage GOA unit in the previous GOA module is connected to a driving signal input end of a n-stage GOA unit in the rear GOA module. Wherein, $1 \leq n \leq m$. As shown in FIG. 3, GOA Unit 7 in the second GOA module is the first-stage GOA unit, and GOA Unit 1 in the first GOA module is the first-stage GOA unit. In addition to a scan line G1, the driving signal output of GOA Unit 1 is also connected to the driving signal input of GOA Unit 7 to provide a driving signal to GOA Unit 7. Similarly, the driving signal output ends Output in GOA Units 2 to 6 are connected to the driving signal input ends Input in GOA Units 8 to 12 in addition to scanning lines G2 to G6 to provide driving signals to GOA Units 8 to 12.

In an embodiment, in the GOA module formed by the m GOA units from the first one, a driving signal input end of each GOA unit is connected to a frame start signal line. As shown in FIG. 3, when m is 6, the first m GOA units are GOA Units 1 to 6, forming the first GOA module. The driving signal input ends Input of GOA Units 1 to 6 are provided by the frame start signal line STV, which is disposed in the signal line setting region.

In an embodiment, the GOA unit further comprises a power signal input end (not shown in the figure). The power signal input end is connected to a power signal line. The GOA unit is usually provided with a pull-up unit or a pull-down unit, etc. The power signal line is disposed in the signal line setting region and comprises a power supply high-potential signal line VGH and a power supply low-potential signal line VSS. The pull-up unit is connected to the power supply high-potential signal line VGH to pull up a potential of a specific node, and the pull-down unit is connected to the power supply low-potential signal line VSS to pull down the potential of a specific node to meet needs of the GOA unit at different working stages.

In an embodiment, the GOA circuit is located on a left or right side of the display region, that is, the driving method of the GOA circuit in the present invention is single-sided driving.

As shown in FIG. 4, GOA Units 4315 to 4320 are the 720th GOA module from the first one, Dummy GOA Units 1 to 6 are the 721st GOA module, and Dummy GOA Units 7 to 12 are the 722nd GOA modules. Each redundant GOA unit in the 721st GOA module provides a reset signal for each effective GOA unit in the 720th GOA module, each redundant GOA unit in the 722nd GOA module provides a reset signal for each redundant GOA unit in the 721st GOA module, and the redundant GOA units in the 722nd GOA module do not reset themselves.

In the prior art, only 6 redundant GOA units are provided to meet reset requirements for the 6 effective GOA units GOA Units 4315 to 4320. However, Dummy GOA Units 1 to 6 do not reset themselves, so an output from the driving signal output of Dummy GOA Units 1 to 6 will be affected by the previous frame driving signal, causing crosstalk. The driving signal output ends Output of Dummy GOA Units 1 to 6 are connected to the reset signal ends Reset in GOA Units 4315 to 4320, so it also has a certain influence on a reset effect of GOA Units 4315 to 4320, so that the gate driving signals received in G4315 to G4315 will also have a certain deviation and affect the display effect. In the embodiment of the present invention, added Dummy GOA Units 7 to 12 reset Dummy GOA Units 1 to 6, so the output of the driving signal output end Output of the Dummy GOA Units 1 to 6 will not be affected by the driving signal of the previous frame, and the crosstalk will not occur. When resetting GOA Units 4315 to 4320, the reset effect is also better. Therefore, compared with current technologies, the display effect is improved.

Figure 6:
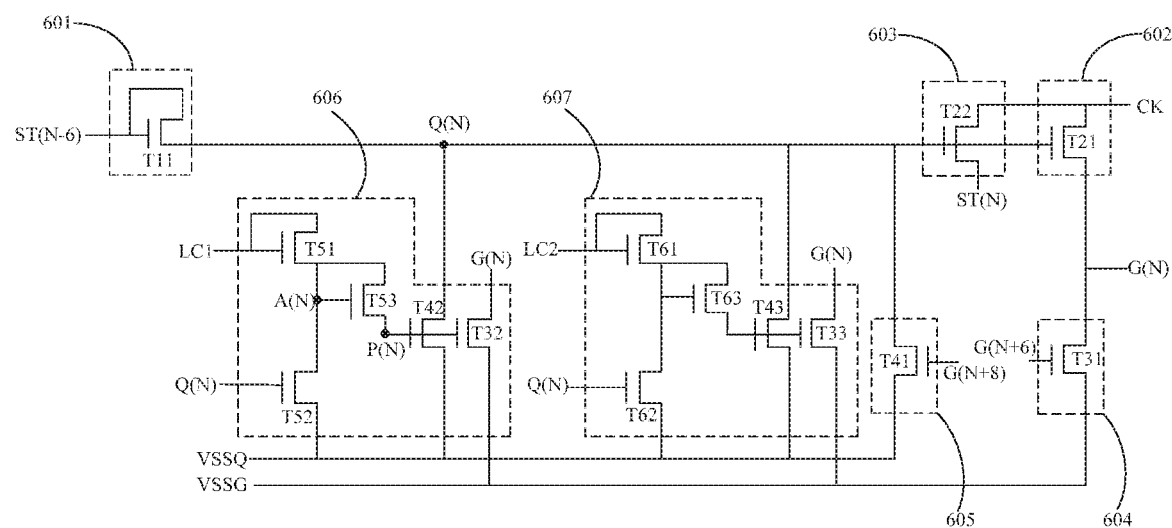
FIG. 6 is a first schematic structural view of an n-stage GOA unit in a GOA circuit of the embodiment of the present invention.

When the structure of the redundant GOA unit is the same as the effective GOA unit, that is, the structures of all GOA units is the same, the structures of the GOA unit of the N-stage in the GOA circuit is shown in FIG. 6, which comprises a pull-up control module 601, a pull-up module 602, a signal download module 603, a first pull-down module 604, a second pull-down module 605, a first pull-down maintenance module 606, and a second pull-down maintenance module 607. The pull-up control module 601 is connected to a first node Q(N) and is used to pull up a potential of the first node Q(N) according to a pre-stage stage transfer signal. The pull-up module 602 is connected to the first node Q(N) and used to pull up a potential of a current-stage gate driving signal G(N) according to a current-stage clock signal CK. The signal download module 603 is connected to the first node Q(N), and is used for controlling an output of a current-stage stage transfer signal ST(N) according to the current-stage clock signal CK. The first pull-down module 604 is used to pull down the potential of the current-stage gate driving signal G(N) according to a first post-stage gate driving signal. The second pull-down module 605 is connected to the first node Q(N) and used to pull down the potential of the first node Q(N) according to a second post-stage gate driving signal. The first pull-down maintenance module 606 is connected to the first node Q(N), and is used to maintain low potentials of the first node Q(N) and the current-stage gate driving signal G(N) according to a first low-frequency clock signal LC1. The second pull-down maintenance module 607 is connected to the first node Q(N), and is used to maintain the low potentials of the first node Q(N) and the current-stage gate driving signal according to a second low-frequency clock signal LC2, wherein the first low-frequency clock signal LC1 and the second low-frequency clock signal LC2 have opposite potentials at the same time. Both the first pull-down maintenance module 606 and the second pull-down maintenance module 607 comprise a reverse unit and a maintenance unit. An output end of the reverse unit is connected to an input end of the maintenance unit. At least one of the reverse units is a first reverse unit. The first reverse unit comprises a first reverse transistor, a second reverse transistor, and a third reverse transistor. A gate and a first electrode of the first reverse transistor are connected to a low-frequency clock signal input end. A second electrode of the first reverse transistor and a first electrode of the second reverse transistor are connected to a second node A(N). A gate of the second reverse transistor is connected to the first node Q(N). A second electrode of the second reverse transistor is connected to a low potential signal VSSQ of a first power supply. A gate and a first electrode of the third reverse transistor are connected to the second node A(N). A second electrode of the third reverse transistor is connected to the input end of the maintenance unit.

As can be seen from the above embodiments, in the GOA circuit of the present invention, the driving signal input end Input of a certain GOA unit is connected to the driving signal output end Output of the GOA unit and is separated from the GOA unit by six stages. A stage transmission signal output by the N-stage GOA unit is the N-stage transmission signal ST(N), and the output gate driving signal is the n-stage gate driving signal G(N). 6≤N≤M, where N is an integer and M is the total number of GOA units in the GOA circuit. The pre-stage stage transfer signal is the stage transfer signal of other GOA units before the N-stage GOA unit, which can be the first pre-stage, the second pre-stage or the previous stages. The first post-stage gate driving signal and the second post-stage gate driving signal are the gate driving signals of other GOA units after the N-stage GOA unit, which may be the first post-stage, the second post-stage, or multiple post-stages. The present invention takes a GOA circuit of a 8K product as an example, the pre-stage stage transfer signal is ST(N−6), the first post-stage gate driving signal is G(N+6), and the second post-stage gate driving signal is G(N+8). Where ST(N−6) is the stage transfer signal before the gate driving signal G(N) of the N-stage and separated from it by six stages, the first post-stage gate driving signal G(N+6) is the gate driving signal after the N-stage gate driving signal G(N) and is separated from it by six stages, and the second post-stage gate driving signal G(N+8) is the gate driving signal after the N-stage gate driving signal G(N) and separated from it by eight stages.

In an embodiment, the pull-up control module 601 comprises a first transistor T11. A gate and a first electrode of the first transistor T11 are connected to the pre-stage stage transfer signal ST(N−6), and a second electrode of the first transistor T11 is connected to the first node Q(N).

In an embodiment, the pull-up module 602 comprises a second transistor T21. A gate of the second transistor T21 is connected to the first node Q(N), a first electrode of the second transistor T21 is connected to the current-stage clock signal CK, and a second electrode of the second transistor T21 is connected to the current-stage gate driving signal G(N).

In an embodiment, the signal download module 603 comprises a third transistor T22. A gate of the third transistor T22 is connected to the first node Q(N), a first electrode of the third transistor T22 is connected to the current-stage clock signal CK, and a second electrode of the third transistor T22 is connected to the current-stage stage transfer signal ST(N).

In an embodiment, the first pull-down module 604 comprises a fourth transistor T31. A gate of the fourth transistor T31 is connected to the first post-stage gate driving signal G(N+6), a first electrode of the fourth transistor T31 is connected to the low potential signal VSSG of the second power supply, and a second electrode of the fourth transistor T31 is connected to the current-stage gate driving signal G(N).

In an embodiment, the second pull-down module 605 comprises a fifth transistor T41. A gate of the fifth transistor T41 is connected to the second post-stage gate driving signal G(N+8), a first electrode of the fifth transistor T41 is connected to the low potential signal VSSQ of the first power supply, and a second electrode of the fifth transistor T41 is connected to the first node Q(N).

In the present invention, both the first pull-down maintenance module 606 and the second pull-down maintenance module 607 are used to maintain the low potentials of the first node Q(N) and the current-stage gate driving signal G(N), so they have the same effect. When the GOA circuit is driven, the first low-frequency clock signal input end of the first pull-down maintenance module 606 inputs the first low-frequency clock signal LC1, and the second low-frequency clock signal input end of the second pull-down maintenance module 607 inputs the second low-frequency clock signal LC2. The first low-frequency clock signal LC1 and the second low-frequency clock signal LC2 are both low-frequency clock signals of 200 times the frame period and a duty ratio of 1/2, and a phase difference between the two is 1/2 period. At the same moment, the phases of the first low-frequency clock signal LC1 and the second low-frequency clock signal LC2 are opposite, so the first pull-down maintenance module 606 and the second pull-down maintenance module 607 can be driven to work alternately. That is, working periods of the two are staggered, and only one pull-down maintenance module is working at the same time. Due to input characteristics of the first low-frequency clock signal LC1 and the second low-frequency clock signal LC2, the input end of the low-frequency clock signal of a certain pull-down maintenance module at the moment is equivalent to receiving a DC signal, wherein the DC signal is high potential, and a value is 28V.

Both the first pull-down maintenance module 606 and the second pull-down maintenance module 607 comprise a reverse unit and a maintenance unit. An output end of the reverse unit is connected to an input end of the maintenance unit. At least one of the reverse units is a first reverse unit. In the embodiment, the reverse units in the first pull-down maintenance module 606 and the second pull-down maintenance module 607 are both the first reverse units. That is, structures of the first pull-down maintenance module 606 and the second pull-down maintenance module 607 are the same. Therefore, FIG. 7 takes the first pull-down maintenance module 606 as an example to describe the structure of the first reverse unit and the maintenance unit, and a specific working principle is also applicable to the second pull-down maintenance module 607.

Figure 7:
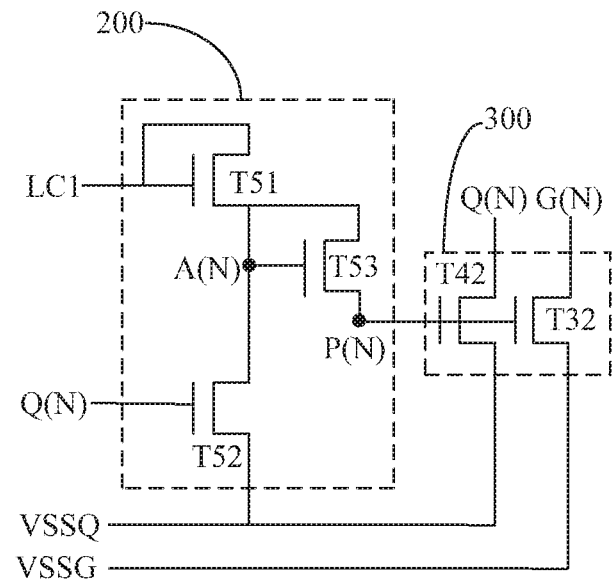
FIG. 7 is a first schematic structural view of a first pull-down maintenance module in the n-stage GOA unit of the GOA circuit according to the embodiment of the present invention.

As shown in FIG. 6, the first pull-down maintenance module 606 comprises a sixth transistor T51, a seventh transistor T52, an eighth transistor T53, a ninth transistor T42, and a tenth transistor T32. The second pull-down maintenance module 607 comprises an eleventh transistor T61, a twelfth transistor T62, a thirteenth transistor T63, a fourteenth transistor T43, and a fifteenth transistor T33. As shown in FIG. 7, the first pull-down maintenance module 606 comprises a first reverse unit 200 and a maintenance unit 300. In the first reverse unit 200, the sixth transistor T51 is a first reverse transistor, the seventh transistor T52 is a second reverse transistor, and the eighth transistor T53 is a third reverse transistor. In the maintenance unit 300, the ninth transistor T42 is a first maintenance transistor, and the tenth transistor T32 is a second maintenance transistor. Similarly, in the first reverse unit 200 of the second pull-down maintenance module 607, the eleventh transistor T61 is the first reverse transistor, the twelfth transistor T62 is the second reverse transistor, and the thirteenth transistor T63 is the third reverse transistor. In the maintenance unit 300 of the second pull-down maintenance module 607, the fourteenth transistor T43 is a first maintenance transistor, and the fifteenth transistor T33 is a second maintenance transistor.

In the present invention, the first electrode and the second electrode of each transistor, one of which is a source and the other is a drain. The first reverse transistor, the second reverse transistor, the third reverse transistor, the first sustain transistor, the second sustain transistor, and other transistors are all N-type or P-type transistors.

In FIG. 7, a gate and a first electrode of the sixth transistor T51 are connected to an input end of the low-frequency clock signal, a second electrode of the sixth transistor T51 and a first electrode of the seventh transistor T52 are connected to the second node A(N), a gate of the seventh transistor T52 is connected to the first node Q(N), and a second electrode of the seventh transistor T52 is connected to the low potential signal VSSQ of the first power supply, a gate and a first electrode of the eighth transistor T53 are connected to the second node A(N), and a second electrode of the eighth transistor T53 is connected to an input end of the maintenance unit 300. A gate of the ninth transistor T42 and a gate of the tenth transistor T32 are connected to an input end of the maintenance unit 300, a first electrode of the ninth transistor T42 is connected to the low potential signal VSSQ of the first power supply, a second electrode of the ninth transistor T42 is connected to the first node Q(N), a first electrode of the tenth transistor T32 is connected to the low potential signal VSSG of the second power, and a second electrode of the tenth transistor T32 is connected to the current-stage gate driving signal G(N). The low-frequency clock signal input end inputs the first low-frequency clock signal LC1, and the input end of the maintenance unit 300 is connected to a fourth node P(N).

When the first pull-down maintenance module 606 is working, a signal input to the low-frequency clock signal input end of the first reverse unit 200 is equivalent to a DC signal, and the value is 28 v. That is, the first low-frequency clock signal LC1 is always at a high potential during operation, so the sixth transistor T51 is always on, which pulling a potential of the second node A(N) high. When the first node Q(N) is at a high potential, the seventh transistor T52 is turned on, and the low potential signal VSSQ of the first power supply pulls the second node A(N) at a low potential. Therefore, the second node A(N) receives the high potential input from the sixth transistor T51 and the low potential input from the seventh transistor T52 at the same time, so that the potential of the second node A(N) is too low to turn on the eighth transistor T53. Thus, the potential of the fourth node P(N) is low, that is, the potential of the input end of the maintenance unit is low, and the ninth transistor T42 and the tenth transistor T32 are turned off. When the first node Q(N) is low, the seventh transistor T52 is turned off, and the second node A(N) only receives the high potential input from the sixth transistor T51. Therefore, the potential of the second node A(N) is high, so that the eighth transistor T53 is turned on, and the potential of the fourth node P(N) is high. That is, the potential of the input end of the maintenance unit 300 is high, the ninth transistor T42 and the tenth transistor T32 are turned on, and the low potential signal VSSQ of the first power supply and the low potential signal VSSG of the second power supply are input to the first node Q(N) and the current-stage gate driving signal G(N), respectively, to maintain the potentials of the two at low potentials.

Figure 8:
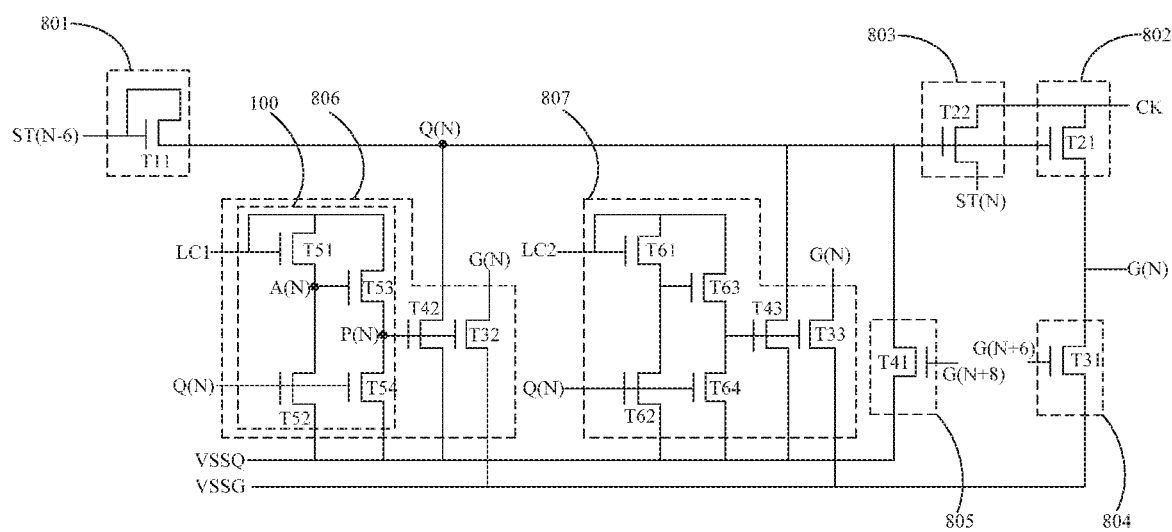
FIG. 8 is a schematic structural view of a first structure of an n-stage GOA unit in a GOA circuit in the prior art.

A structure of a N-stage GOA unit in the current 8K product is shown in FIG. 8, which comprises a pull-up control module 801, a pull-up module 802, a signal download module 803, a first pull-down module 804, a second pull-down module 805, a first pull-down maintenance module 806, and a second pull-down maintenance module 807. The pull-up control module 801 comprises the transistor T11, the pull-up module 802 comprises the transistor T21, the signal download module 803 comprises the transistor T22, the first pull-down module 804 comprises the transistor T31, the second pull-down module 805 comprises the transistor T41, the first pull-down maintenance module 806 comprises the transistors T51, T52, T53, T54, T32, T42, and the second pull-down maintenance module 807 comprises the transistors T61, T62, T63, T64, T33, T43. A connection of each transistor is shown in the figure. The first pull-down maintenance module 806 comprises an inverter 100 and the transistors T32 and T42. The inverter 100 is composed of 4 transistors, and its working principle is: when the potential of Q(N) is low, T52 and T54 are turned off, T51 is turned on, making the potential of a point A high to turn on T53, and the point P(N) is high. When the potential at the point Q(N) is high, T52 and T54 are turned on, VSSQ inputs a low potential to the point A, T51 is turned on to input high potential to the point A. A combination of the two makes the potential at the point A low, and T53 cannot turn on normally, so the point P(N) is low. That is, the inverter 100 always reverses the potential at the point Q(N) and the point P(N). However, due to the 8 k product having a narrow border limitation and a large load, a space for the GOA circuit is relatively tight. In the current first pull-down maintenance module 806 and the second pull-down maintenance module 807, the inverter 100 needs 4 transistors to achieve a opposite potential of the Q(N) point and the P(N) point, so that the entire N-stage GOA unit requires 18 transistors, which results in too much space in the GOA circuit and cannot meet the needs of the 8K product.

In the first pull-down maintenance module 606 and the second pull-down maintenance module 607 in the embodiment, the reverse units are both the first reverse units 200. Each first reverse unit 200 only needs three transistors to achieve an opposite potential of the signals at the input end of the first node and the maintenance unit, so the GOA unit of the N-stage in the GOA circuit only needs 16 transistors. Compared with the prior art, two transistors are reduced, so that the structure of the GOA circuit is simplified, and the space occupied by the GOA circuit is saved. For each stage of GOA unit in the GOA circuit, the same settings as the N-stage GOA unit can be used.

Figure 9:
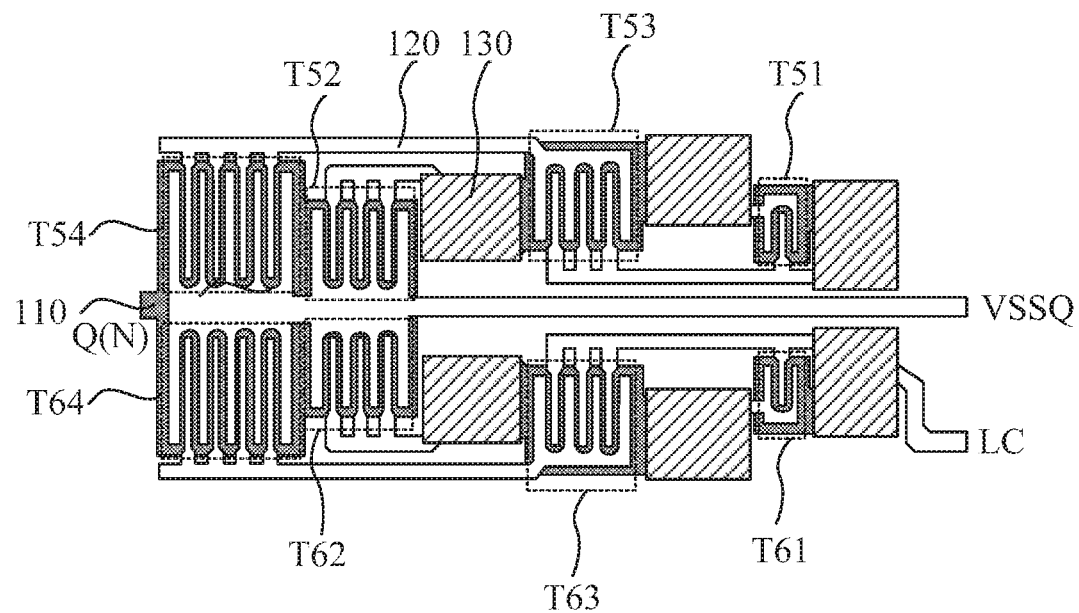
FIG. 9 is a schematic structural view of a film stacking structure of reverse units in a first pull-down maintenance module and a second pull-down maintenance module in the n-stage GOA unit of the GOA circuit in the prior art.
Figure 10:
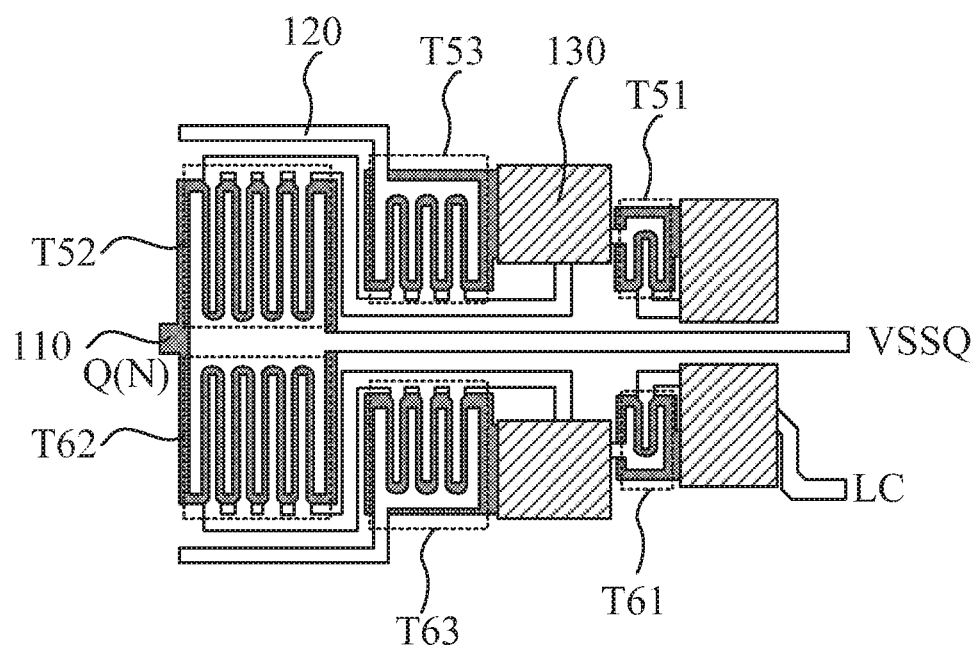
FIG. 10 is a schematic structural view of a film stacking structure of reverse units in a first pull-down maintenance module and a second pull-down maintenance module in the n-stage GOA unit of the GOA circuit according to the embodiment of the present invention.

FIG. 9 and FIG. 10 respectively show film stacking structures of the reverse units in the first pull-down maintenance module and the second pull-down maintenance module of the N-stage GOA unit in the GOA circuit provided by the prior art and the embodiments of the present invention. Each film layer comprises a first metal layer 110, a source-drain layer 120, and a connection member 130. A portion where the first metal layer 110 overlaps with the active layer (not shown) forms a gate of each transistor, and also forms the first node Q(N). The source-drain layer 120 forms a source and a drain, a low-potential signal line VSSQ of a first power supply, and a low-frequency clock signal line LC of each transistor. One end of the connection member 130 covers the source-drain layer 120, and the other end is connected to a via hole in the first metal layer 110 to realize a connection between the gate of one transistor and the source or drain of the other transistor. A material of the connection member 130 is indium tin oxide.

As can be seen from the comparison between FIG. 9 and FIG. 10, in the prior art, each inverter needs to be provided with four transistors, and three connection members are required for connections. The structure is more complicated and takes up more space. In the present invention, only three transistors are needed for each reverse unit, and only two connecting members are required for connections. The structure is relatively simple, takes up less space, and simplifies the manufacturing process and saves costs.

In the above embodiment, the reverse units in the first pull-down maintenance module 606 and the second pull-down maintenance module 607 are the first reverse units 200, but the present invention is not limited. In an embodiment, one of the first pull-down maintenance module 606 and the second pull-down maintenance module 607 is the first reverse unit, and the other reverse unit is the second reverse unit. The second reverse unit comprises a fourth reverse transistor, a fifth reverse transistor, a sixth reverse transistor, and a seventh reverse transistor. A gate and a first electrode of the fourth reverse transistor are connected to the low-frequency clock signal input end, and a second electrode of the fourth reverse transistor and a first electrode of the fifth reverse transistor are connected to a third node. A gate of the fifth reverse transistor is connected to the first node, and a second electrode of the fifth reverse transistor is connected to the low potential signal of the first power supply. A gate of the sixth reverse transistor is connected to the third node, a first electrode of the sixth reverse transistor is connected to the first electrode of the fourth reverse transistor, and a second electrode of the sixth reverse transistor and a first electrode of the seventh reverse transistor are connected to the input end of the maintenance unit. A gate of the seventh reverse transistor is connected to the first node, and a second electrode of the seventh reverse transistor is connected to the low potential signal of the first power supply.

Figure 11:
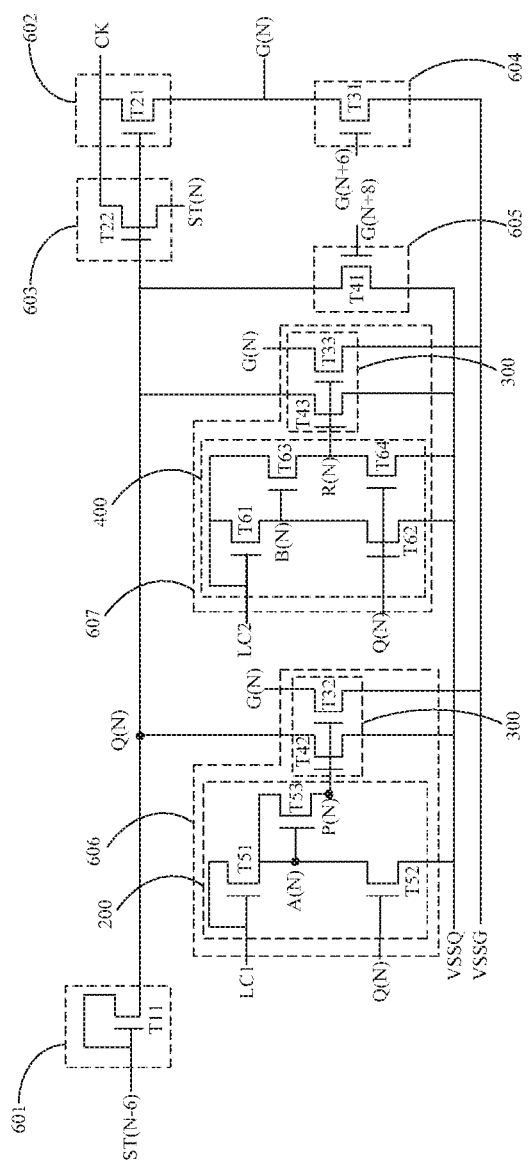
FIG. 11 is a schematic structural view of a second structure of the n-stage GOA unit in the GOA circuit of the embodiment of the present invention.

As shown in FIG. 11, which is a schematic view of a second structure of the N-stage GOA unit in the GOA circuit provided by the embodiment of the present invention. In the embodiment, a reverse unit in the first pull-down maintenance module 606 is the first reverse unit 200, and a structure is the same as in FIG. 3. A reverse unit in the second pull-down maintenance module 607 is the second reverse unit 400. The second reverse unit 400 comprises an eleventh transistor T61, a twelfth transistor T62, a thirteenth transistor T63, and a sixteenth transistor T64. The eleventh transistor T61 is a fourth reverse transistor, the twelfth transistor T62 is a fifth reverse transistor, the thirteenth transistor T63 is a sixth reverse transistor, and the sixteenth transistor T64 is a seventh reverse transistor.

A gate and a first electrode of the eleventh transistor T61 are connected to an input end of a low-frequency clock signal. A second electrode of the eleventh transistor T61 and a first electrode of the twelfth transistor T62 are connected to a third node B(N). A gate of the twelfth transistor T62 is connected to the first node Q(N), and a second electrode of the twelfth transistor T62 is connected to a low potential signal VSSQ of a first power supply. A gate of the thirteenth transistor T63 is connected to the third node B(N), and a first electrode of the thirteenth transistor T63 is connected to the first electrode of the eleventh transistor T61. A second electrode of the thirteenth transistor T63 and a first electrode of the sixteenth transistor T64 are connected to an input end of a maintenance unit 300. A gate of the sixteenth transistor T64 is connected to the first node Q(N), and a second electrode of the sixteenth transistor T64 is connected to the low potential signal VSSQ of the first power supply. A second low-frequency clock signal LC2 is input to a low-frequency clock signal input end, and an input end of the maintenance unit 300 is connected to a fifth node R(N).

A structure in the second reverse unit 400 is the same as that in the prior art, so it can also play a role of inverting a potential of the first node Q(N) and the input end of the maintenance unit 300. In the embodiment, the reverse unit in the first pull-down maintenance module 606 is designed as the first reverse unit 200, and the reverse unit in the second pull-down maintenance module 607 is designed as the second reverse unit 400, or the reverse unit in the first pull-down maintenance module 606 is designed as the second reverse unit 400, and the reverse unit in the second pull-down maintenance module 607 is designed as the first reverse unit 200, both of them can make a total number of transistors in the N-stage GOA unit be 16. Compared with the prior art, one transistor is reduced, so the GOA circuit structure is simplified, and the occupied space is saved.

The present invention further provides the electronic device, comprising a display panel and a driving chip. The display panel comprises a plurality of scan lines, 2m clock signal lines, and a GOA circuit. The scan lines are disposed in a display region. The clock signal lines are disposed in a signal line setting region in a non-display region. The GOA circuit is disposed between the display region and the signal line setting region, wherein the GOA circuit comprises a plurality of cascaded GOA units. The GOA units comprise a plurality of effective GOA units and 2m redundant GOA units arranged in sequence. Driving signal output ends of the effective GOA units are sequentially connected to the scan lines corresponding one-to-one. The plurality of effective GOA units forms a plurality of effective GOA modules that are arranged in sequence. Each effective GOA module comprises 2m effective GOA units, wherein in the effective GOA module, clock signal input ends of the 2m effective GOA units are sequentially connected to the 2m clock signal lines corresponding one-to-one, and clock signal input ends of the 2m redundant GOA units are sequentially connected to the 2m clock signal lines corresponding one-to-one.

In an embodiment, structures of the 2m redundant GOA units are the same.

In an embodiment, structures of the redundant GOA unit and the effective GOA unit are the same.

In an embodiment, in the GOA circuit, every m GOA units form a GOA module from a first one, and a rear GOA module is used to provide a reset signal to a previous GOA module between the adjacent GOA modules.

In an embodiment, a driving signal output end of an n-stage GOA unit in the rear GOA module is connected to a reset signal end of an n-stage GOA unit in the previous GOA module.

In an embodiment, a driving signal output end of an n-stage GOA unit in the previous GOA module is connected to a driving signal input end of a n-stage GOA unit in the rear GOA module.

In an embodiment, in the GOA module formed by the m GOA units from the first one, a driving signal input end of each GOA unit is connected to a frame start signal line.

In an embodiment, the GOA unit further comprises a power signal input end, and the power signal input end is connected to the power signal line.

In an embodiment, the GOA circuit is disposed on a left or right side of the display region.

In an embodiment, in the GOA circuit, an N-stage GOA unit comprises:

a pull-up control module connected to a first node to pull up a potential of the first node according to a pre-stage stage transfer signal;

a pull-up module connected to the first node to pull up a potential of a current-stage gate driving signal according to a current-stage clock signal;

a signal download module connected to the first node to control an output of a current-stage stage transfer signal according to the current-stage clock signal;

a first pull-down module used to pull down the potential of the current-stage gate driving signal according to a first post-stage gate driving signal;

a second pull-down module connected to the first node and used to pull down the potential of the first node according to a second post-stage gate driving signal;

a first pull-down maintenance module connected to the first node to maintain low potentials of the first node and the current-stage gate driving signal according to a first low-frequency clock signal; and a second pull-down maintenance module connected to the first node to maintain the low potentials of the first node and the current-stage gate driving signal according to a second low-frequency clock signal, wherein the first low-frequency clock signal and the second low-frequency clock signal have opposite potentials at a same time;

wherein both the first pull-down maintenance module and the second pull-down maintenance module comprise a reverse unit and a maintenance unit, an output end of the reverse unit is connected to an input end of the maintenance unit, at least one of the reverse units is a first reverse unit, the first reverse unit comprises a first reverse transistor, a second reverse transistor, and a third reverse transistor, a gate and a first electrode of the first reverse transistor are connected to a low-frequency clock signal input end, a second electrode of the first reverse transistor and a first electrode of the second reverse transistor are connected to a second node, a gate of the second reverse transistor is connected to the first node, a second electrode of the second reverse transistor is connected to a low potential signal of a first power supply, a gate and a first electrode of the third reverse transistor are connected to the second node, and a second electrode of the third reverse transistor is connected to the input end of the maintenance unit.

In an embodiment, the maintenance unit comprises a first maintenance transistor and a second maintenance transistor, a gate of the first maintenance transistor and a gate of the second maintenance transistor are connected to the input end of the maintenance unit, a first electrode of the first maintenance transistor is connected to the low potential signal of the first power supply, a second electrode of the first maintenance transistor is connected to the first node, a first electrode of the second maintenance transistor is connected to a low potential signal of a second power supply, and a second electrode of the second maintenance transistor is connected to the current-stage gate driving signal.

The electronic device of the present invention may be an 8K product with a resolution of 7680*4320. The display panel may be a liquid crystal display panel or an OLED display panel, and a timing controller is provided in a driving chip. A clock signal in each clock signal line in the display panel is provided by the timing controller. The number of GOA units connected to each clock signal line in the display panel is equal, so the load of each clock signal line is the same, and the periodic dark lines will not be generated at the low gray levels, and the display effect is better.

According to the above embodiment:

Embodiments of the present invention provide the display panel and the electronic device. The display panel comprises a plurality of scan lines, 2m clock signal lines, and the GOA circuit. The plurality of scan lines is disposed in a display region. The clock signal lines are disposed in a signal line setting region in a non-display region. The GOA circuit is disposed between the display region and the signal line setting region. The GOA circuit comprises the plurality of cascaded GOA units. The GOA units comprise the plurality of effective GOA units and 2m redundant GOA units arranged in sequence. Driving signal output ends of the effective GOA units are sequentially connected to the scan lines corresponding one-to-one. The plurality of effective GOA units forms a plurality of effective GOA modules that are arranged in sequence. Each effective GOA module comprises 2m effective GOA units, wherein in the effective GOA module, clock signal input ends of the 2m effective GOA units are sequentially connected to the 2m clock signal lines corresponding one-to-one, and clock signal input ends of the 2m redundant GOA units are sequentially connected to the 2m clock signal lines corresponding one-to-one. In the present invention, the number of GOA units connected to each clock signal line is equal, so the load of each clock signal line is the same, and the periodic dark lines will not be generated at the low gray levels.

In the above embodiments, the description of each embodiment has its own emphasis. For a part that is not detailed in an embodiment, one can refer to the related descriptions of other embodiments.

The display panel and the electronic device provided by the embodiments of the present invention are described in detail above. The article applies specific examples to explain the principles and implementation of the present invention. The descriptions of the above embodiments are only used to help understand the technical solutions and core ideas of the present invention. Those of ordinary skill in the art should understand that they can still modify the technical solutions described in the foregoing embodiments, or equivalently replace some of the technical features. However, the modifications or substitutions do not deviate the essence of the corresponding technical solutions from the scope of the technical solutions of the embodiments of the present invention.

What is claimed is:

1. A display panel, comprising:
a plurality of scan lines disposed in a display region;
2m clock signal lines disposed in a signal line setting region in a non-display region; and
a gate driver on array (GOA) circuit disposed between the display region and the signal line setting region, wherein the GOA circuit comprises a plurality of cascaded GOA units, the GOA units comprise a plurality of effective GOA units and 2m redundant GOA units arranged in sequence, driving signal output ends of the effective GOA units are sequentially connected to the scan lines corresponding one-to-one, the plurality of effective GOA units forms a plurality of effective GOA modules that are arranged in sequence, each effective GOA module comprises 2m effective GOA units, wherein in the effective GOA module, clock signal input ends of the 2m effective GOA units are sequentially connected to the 2m clock signal lines corresponding one-to-one, and clock signal input ends of the 2m redundant GOA units are sequentially connected to the 2m clock signal lines corresponding one-to-one, wherein in the GOA circuit, an n-stage GOA unit comprises:
a pull-up control module connected to a first node to pull up a potential of the first node according to a pre-stage stage transfer signal;
a pull-up module connected to the first node to pull up a potential of a current-stage gate driving signal according to a current-stage clock signal;
a signal download module connected to the first node to control an output of a current-stage stage transfer signal according to the current-stage clock signal;
a first pull-down module used to pull down the potential of the current-stage gate driving signal according to a first post-stage gate driving signal;
a second pull-down module connected to the first node and used to pull down the potential of the first node according to a second post-stage gate driving signal;
a first pull-down maintenance module connected to the first node to maintain low potentials of the first node and the current-stage gate driving signal according to a first low-frequency clock signal;
a second pull-down maintenance module connected to the first node to maintain the low potentials of the first node and the current-stage gate driving signal according to a second low-frequency clock signal, wherein the first low-frequency clock signal and the second low-frequency clock signal have opposite potentials at a same time; and wherein both the first pull-down maintenance module and the second pull-down maintenance module comprise a reverse unit and a maintenance unit, an output end of the reverse unit is connected to an input end of the maintenance unit, at least one of the reverse units is a first reverse unit, the first reverse unit comprises a first reverse transistor, a second reverse transistor, and a third reverse transistor, a gate and a first electrode of the first reverse transistor are connected to a low-frequency clock signal input end, a second electrode of the first reverse transistor and a first electrode of the second reverse transistor are connected to a second node, a gate of the second reverse transistor is connected to the first node, a second electrode of the second reverse transistor is connected to a low potential signal of a first power supply, a gate and a first electrode of the third reverse transistor are connected to the second node, and a second electrode of the third reverse transistor is connected to the input end of the maintenance unit.

2. The display panel as claimed in claim 1, wherein structures of the 2m redundant GOA units are same.

3. The display panel as claimed in claim 2, wherein structures of the redundant GOA unit and the effective GOA unit are the same.

4. The display panel as claimed in claim 1, wherein in the GOA circuit, every m GOA units form a GOA module from a first one, and a rear GOA module is used to provide a reset signal to a previous GOA module between adjacent GOA modules.

5. The display panel as claimed in claim 4, wherein a driving signal output end of an n-stage GOA unit in the rear GOA module is connected to a reset signal end of an n-stage GOA unit in the previous GOA module.

6. The display panel as claimed in claim 4, wherein a driving signal output end of an n-stage GOA unit in the previous GOA module is connected to a driving signal input end of an n-stage GOA unit in the rear GOA module.

7. The display panel as claimed in claim 4, wherein in the GOA module formed by the m GOA units from the first one, a driving signal input end of each GOA unit is connected to a frame start signal line.

8. The display panel as claimed in claim 1, wherein the maintenance unit comprises a first maintenance transistor and a second maintenance transistor, a gate of the first maintenance transistor and a gate of the second maintenance transistor are connected to the input end of the maintenance unit, a first electrode of the first maintenance transistor is connected to the low potential signal of the first power supply, a second electrode of the first maintenance transistor is connected to the first node, a first electrode of the second maintenance transistor is connected to a low potential signal of a second power supply, and a second electrode of the second maintenance transistor is connected to the current-stage gate driving signal.

9. The display panel as claimed in claim 1, wherein both the reverse units in the first pull-down maintenance module and the second pull-down maintenance module are the first reverse units.

10. The display panel as claimed in claim 1, wherein one of the reverse units in the first pull-down maintenance module and the second pull-down maintenance module is the first reverse unit, and another reverse unit is a second reverse unit, the second reverse unit comprises a fourth reverse transistor, a fifth reverse transistor, a sixth reverse transistor, and a seventh reverse transistor, a gate and a first electrode of the fourth reverse transistor are connected to the low-frequency clock signal input end, a second electrode of the fourth reverse transistor and a first electrode of the fifth reverse transistor are connected to a third node, a gate of the fifth reverse transistor is connected to the first node, a second electrode of the fifth reverse transistor is connected to the low potential signal of the first power supply, a gate of the sixth reverse transistor is connected to the third node, a first electrode of the sixth reverse transistor is connected to the first electrode of the fourth reverse transistor, a second electrode of the sixth reverse transistor and a first electrode of the seventh reverse transistor are connected to the input end of the maintenance unit, a gate of the seventh reverse transistor is connected to the first node, and a second electrode of the seventh reverse transistor is connected to the low potential signal of the first power supply.

11. The display panel as claimed in claim 1, wherein the pull-up control module comprises a first transistor, a gate and a first electrode of the first transistor connected to the pre-stage stage transfer signal, and a second electrode of the first transistor is connected to the first node.

12. The display panel as claimed in claim 11, wherein the pull-up module comprises a second transistor, a gate of the second transistor is connected to the first node, a first electrode of the second transistor is connected to the current-stage clock signal, and a second electrode of the second transistor is connected to the current-stage gate driving signal.

13. The display panel as claimed in claim 12, wherein the signal download module comprises a third transistor, a gate of the third transistor is connected to the first node, a first electrode of the third transistor is connected to the current-stage clock signal, and a second electrode of the third transistor is connected to the current-stage stage transfer signal.

14. The display panel as claimed in claim 13, wherein the first pull-down module comprises a fourth transistor, a gate of the fourth transistor is connected to the first post-stage gate driving signal, a first electrode of the fourth transistor is connected to the low potential signal of the second power supply, and a second electrode of the fourth transistor is connected to the current-stage gate driving signal.

15. The display panel as claimed in claim 14, wherein the second pull-down module comprises a fifth transistor, a gate of the fifth transistor is connected to the second post-stage gate driving signal, a first electrode of the fifth transistor is connected to the low potential signal of the first power supply, and a second electrode of the fifth transistor is connected to the first node.

16. An electronic device, comprising a display panel and a driving chip, wherein the display panel comprises:
a plurality of scan lines disposed in a display region;
2m clock signal lines disposed in a signal line setting region in a non-display region; and
a GOA circuit disposed between the display region and the signal line setting region, wherein the GOA circuit comprises a plurality of cascaded GOA units, the cascaded GOA units comprise a plurality of effective GOA units and 2m redundant GOA units arranged in sequence, driving signal output ends of the effective GOA units are sequentially connected to the scan lines corresponding one-to-one, the plurality of effective GOA units forms a plurality of effective GOA modules that are arranged in sequence, each effective GOA module comprises 2m effective GOA units, wherein in the effective GOA module, clock signal input ends of the 2m effective GOA units are sequentially connected to the 2m clock signal lines corresponding one-to-one, and the clock signal input ends of the 2m redundant GOA units are sequentially connected to the 2m clock signal lines corresponding one-to-one wherein in the GOA circuit, an n-stage GOA unit comprises:
a pull-up control module connected to a first node to pull up a potential of the first node according to a pre-stage stage transfer signal;
a pull-up module connected to the first node to pull up a potential of a current-stage gate driving signal according to a current-stage clock signal;
a signal download module connected to the first node to control an output of a current-stage stage transfer signal according to the current-stage clock signal;
a first pull-down module used to pull down the potential of the current-stage gate driving signal according to a first post-stage gate driving signal;
a second pull-down module connected to the first node and used to pull down the potential of the first node according to a second post-stage gate driving signal;
a first pull-down maintenance module connected to the first node to maintain low potentials of the first node and the current-stage gate driving signal according to a first low-frequency clock signal;
a second pull-down maintenance module connected to the first node to maintain the low potentials of the first node and the current-stage gate driving signal according to a second low-frequency clock signal, wherein the first low-frequency clock signal and the second low-frequency clock signal have opposite potentials at a same time; and wherein both the first pull-down maintenance module and the second pull-down maintenance module comprise a reverse unit and a maintenance unit, an output end of the reverse unit is connected to an input end of the maintenance unit, at least one of the reverse units is a first reverse unit, the first reverse unit comprises a first reverse transistor, a second reverse transistor, and a third reverse transistor, a gate and a first electrode of the first reverse transistor are connected to a low-frequency clock signal input end, a second electrode of the first reverse transistor and a first electrode of the second reverse transistor are connected to a second node, a gate of the second reverse transistor is connected to the first node, a second electrode of the second reverse transistor is connected to a low potential signal of a first power supply, a gate and a first electrode of the third reverse transistor are connected to the second node, and a second electrode of the third reverse transistor is connected to the input end of the maintenance unit.

17. The electronic device as claimed in claim 16, wherein structures of the 2m redundant GOA units are same.

18. The electronic device as claimed in claim 17, wherein structures of the redundant GOA unit and the effective GOA units are the same.

19. The electronic device as claimed in claim 16, wherein in the GOA circuit, every m GOA units form a GOA module from a first one, and a rear GOA module is used to provide a reset signal to a previous GOA module between adjacent GOA module.

* * * * *